(12) United States Patent
Yang

(10) Patent No.: US 12,082,477 B2
(45) Date of Patent: Sep. 3, 2024

(54) DISPLAY PANEL INCLUDING LIGHT EXTRACTION UNIT AND MOBILE TERMINAL INCLUDING THE SAME

(71) Applicant: WUHAN CHINA STAR OPTOELECTRONICS SEMICONDUCTOR DISPLAY TECHNOLOGY CO., LTD., Wuhan (CN)

(72) Inventor: Wenhua Yang, Wuhan (CN)

(*) Notice: Subject to any disclaimer, the term of this patent is extended or adjusted under 35 U.S.C. 154(b) by 0 days.

(21) Appl. No.: 17/622,829

(22) PCT Filed: Oct. 11, 2021

(86) PCT No.: PCT/CN2021/123089
§ 371 (c)(1),
(2) Date: Dec. 26, 2021

(87) PCT Pub. No.: WO2023/039963
PCT Pub. Date: Mar. 23, 2023

(65) Prior Publication Data
US 2024/0032391 A1   Jan. 25, 2024

(30) Foreign Application Priority Data
Sep. 17, 2021   (CN) .......................... 202111091676.2

(51) Int. Cl.
H10K 59/80   (2023.01)
H10K 59/126  (2023.01)
H10K 59/35   (2023.01)

(52) U.S. Cl.
CPC ......... *H10K 59/873* (2023.02); *H10K 59/126* (2023.02); *H10K 59/352* (2023.02); *H10K 59/879* (2023.02)

(58) Field of Classification Search
CPC ... H10K 59/873; H10K 59/126; H10K 59/352
See application file for complete search history.

(56) References Cited

U.S. PATENT DOCUMENTS

2016/0087241 A1   3/2016  Kim

FOREIGN PATENT DOCUMENTS

| CN | 108598285 A | 9/2018 |
| CN | 108899438 A | 11/2018 |
| CN | 109713164 A | 5/2019 |

(Continued)

OTHER PUBLICATIONS

Chinese Office Action issued in corresponding Chinese Patent Application No. 202111091676.2 dated May 16, 2022, pp. 1-8.
(Continued)

*Primary Examiner* — Joseph L Williams

(57) ABSTRACT

Embodiments of the present application disclose a display panel and a mobile terminal. The display panel includes a light-emitting functional layer and a thin-film encapsulation layer, the light-emitting functional layer includes a plurality of first light-emitting units and a plurality of first light extractors including ultraviolet light absorbing materials. In one embodiment of the present application, the first light extraction unit including ultraviolet light absorbing material is provided to absorb or extinct ultraviolet light, thereby alleviating the decrease in the color temperature of the display panel caused by the damage of ultraviolet light to the light-emitting material.

20 Claims, 7 Drawing Sheets

(56) References Cited

FOREIGN PATENT DOCUMENTS

| | | | |
|---|---|---|---|
| CN | 111816793 | A | 10/2020 |
| CN | 212695182 | U | 3/2021 |
| CN | 112652729 | A | 4/2021 |
| CN | 113054138 | A | 6/2021 |
| JP | 2009510696 | A | 3/2009 |
| JP | 2011113737 | A | 6/2011 |
| KR | 100730220 | B1 | 6/2007 |
| KR | 20190058405 | A | 5/2019 |
| KR | 20190143556 | A | 12/2019 |

OTHER PUBLICATIONS

International Search Report in International application No. PCT/CN2021/123089, mailed on Mar. 28, 2022.
Written Opinion of the International Search Authority in International application No. PCT/CN2021/123089, mailed on Mar. 28, 2022.
Japanese Office Action issued in corresponding Japanese Patent Application No. 特願 2022-502953 dated Nov. 7, 2023, pp. 1-3.
Korean Office Action issued in corresponding Korean Patent Application No. 10-2022-7004784 dated Mar. 25, 2024, pp. 1-6.

DISPLAY PANEL INCLUDING LIGHT EXTRACTION UNIT AND MOBILE TERMINAL INCLUDING THE SAME

FIELD OF APPLICATION

The present application relates to a display technology field, and particularly to a display panel and a mobile terminal.

BACKGROUND

In recent years, organic light-emitting diode (OLED) display panels have been used all over the world due to advantages of high contrast, wide color gamut, and fast response time. Since energies of ultraviolet radiation in different regions are different due to the different regions of the world have different latitudes and longitudes. In order to study limits of solar light experimental conditions of using OLED display panels, artificial solar light or ultraviolet light mask experiments are usually used to simulate a lifespan of solar light of OLED display panels. However, after OLED display panels are irradiated by sunlight or ultraviolet light, a display color temperature is reduced, thereby affecting display effects thereof.

Therefore, there is an urgent need for a display panel and a mobile terminal to solve above technical problems.

SUMMARY OF DISCLOSURE

Embodiments of the present application provide a display panel and a mobile terminal, which can alleviate the current technical problem that the display color temperature of an OLED display panel decreases after being irradiated by sunlight or ultraviolet light.

For solving above problems, technical solutions provided by this application are as follows:

Embodiments of the present application provide a display, comprising a light-emitting functional layer and a thin-film encapsulation layer on the light-emitting functional layer, wherein:

the light-emitting functional layer comprises a plurality of first light-emitting units of emitting light of a first color, a plurality of first light extraction units corresponding to the first light-emitting units, and the first light extraction units are located between the first light-emitting units and the thin-film encapsulation layer; and the light of the first color is blue light, the first light extraction units comprise an ultraviolet light absorbing material, and an extinction coefficient of the first light extraction units for the ultraviolet light is greater than an extinction coefficient of the thin-film encapsulation layer for the ultraviolet light.

In one embodiment, the ultraviolet light absorbing material comprises at least one of benzotriazole derivatives, salicylate esters, benzophenones, benzotriazoles, substituted acrylonitrile triazines and triazines, and a mass ratio of the ultraviolet light absorbing material in the first light extraction unit is 0.01% to 0.05%.

In one embodiment, the extinction coefficient of the first light extraction unit for light with a wavelength of 390 nm is 0.85 $mol^{-1} cm^{-1}$ to 0.95 $mol^{-1} cm^{-1}$, and the extinction coefficient of the first light extraction unit for light with a wavelength of 400 nm is 0.55 $mol^{-1} cm^{-1}$ to 0.65 $mol^{-1} cm^{-1}$.

In one embodiment, the light-emitting functional layer further comprises a plurality of second light-emitting units emitting light of a second color, a plurality of third light-emitting units emitting light of a third color, a plurality of second light extraction units provided corresponding to the second light-emitting units, and a plurality of third light extraction units provided corresponding to the third light-emitting units; and the light of the second color is red light, the light of the third color is green light, and the extinction coefficient of the first light extraction units for ultraviolet light is greater than the extinction coefficient of the second light extraction unit for ultraviolet light.

In one embodiment, the light-emitting functional layer further comprises a plurality of second light-emitting units emitting light of a second color and a plurality of third light-emitting units emitting light of a third color; and in a top view direction of the display panel, the first light extraction unit is formed as a whole layer, and the first light extraction unit covers the first light-emitting units, the second light-emitting units, and the third light-emitting units.

In one embodiment, a refractive index of any inorganic film layer in the thin-film encapsulation layer is less than a refractive index of the first light extraction units.

In one embodiment, the refractive index of any inorganic film layer in the thin-film encapsulation layer is 1.78 to 1.85.

In one embodiment, the thin-film encapsulation layer comprises a first inorganic layer on a side close to the light-emitting functional layer and a second inorganic layer on the first inorganic layer; and a refractive index of the second inorganic layer is greater than a refractive index of the first inorganic layer.

In one embodiment, the light-emitting functional layer comprises an anode layer, a hole transport layer on the anode layer, a light-emitting material layer on the hole transport layer, and a cathode layer on the light-emitting material layer; and the hole transport layer comprises a hole type dopant having an electron-attracting group, and a mass ratio of the hole type dopant in the hole transport layer is 0.8% to 1.2%, and the hole type dopant comprises at least one of HAT-CN, $F_4$-TCNQ, $SbCl_5$ or $FeCl_3$.

In one embodiment, the light-emitting functional layer comprises an anode layer, a hole transport layer on the anode layer, a light-emitting material layer on the hole transport layer, and a cathode layer on the light-emitting material layer; and the hole transport layer comprises a hole type dopant having an electron-attracting group, and a mass ratio of the hole type dopant in the hole transport layer is 0.8% to 1.2%, and the hole type dopant comprises at least one of HAT-CN, $F_4$-TCNQ, $SbCl_5$ or $FeCl_3$.

Embodiment of the present application further provides a mobile terminal, comprising a display panel and a terminal body, the terminal body and the display panel are combined into one body, and the display panel comprises a light-emitting functional layer and a thin-film encapsulation layer on the light-emitting functional layer, wherein:

the light-emitting functional layer comprises a plurality of first light-emitting units of emitting light of a first color, a plurality of first light extraction units corresponding to the first light-emitting units, and the first light extraction units are located between the first light-emitting units and the thin-film encapsulation layer; and the light of the first color is blue light, the first light extraction units comprise an ultraviolet light absorbing material, and an extinction coefficient of the first light extraction units for the ultraviolet light is greater than an extinction coefficient of the thin-film encapsulation layer for the ultraviolet light.

In one embodiment, the ultraviolet light absorbing material comprises at least one of benzotriazole derivatives, salicylate esters, benzophenones, benzotriazoles, substituted acrylonitrile triazines and triazines; and a mass ratio of the ultraviolet light absorbing material in the first light extraction unit is 0.01% to 0.05%.

In one embodiment, the extinction coefficient of the first light extraction unit for light with a wavelength of 390 nm is 0.85 $mol^{-1}$ $cm^{-1}$ to 0.95 $mol^{-1}$ $cm^{-1}$, and the extinction coefficient of the first light extraction unit for light with a wavelength of 400 nm is 0.55 $mol^{-1}cm^{-1}$ to 0.65 $mol^{-1}cm^{-1}$.

In one embodiment, the light-emitting functional layer further comprises a plurality of second light-emitting units emitting light of a second color, a plurality of third light-emitting units emitting light of a third color, a plurality of second light extraction units provided corresponding to the second light-emitting units, and a plurality of third light extraction units provided corresponding to the third light-emitting units; and the light of the second color is red light, the light of the third color is green light, and the extinction coefficient of the first light extraction units for ultraviolet light is greater than the extinction coefficient of the second light extraction unit for ultraviolet light.

In one embodiment, the light-emitting functional layer further comprises a plurality of second light-emitting units emitting light of a second color and a plurality of third light-emitting units emitting light of a third color; and in a top view direction of the display panel, the first light extraction unit is formed as a whole layer, and the first light extraction unit covers the first light-emitting units, the second light-emitting units, and the third light-emitting units.

In one embodiment, a refractive index of any inorganic film layer in the thin-film encapsulation layer is less than a refractive index of the first light extraction units.

In one embodiment, the refractive index of any inorganic film layer in the thin-film encapsulation layer is 1.78 to 1.85.

In one embodiment, the thin-film encapsulation layer comprises a first inorganic layer on a side close to the light-emitting functional layer and a second inorganic layer on the first inorganic layer; and a refractive index of the second inorganic layer is greater than a refractive index of the first inorganic layer.

In one embodiment, the light-emitting functional layer comprises an anode layer, a hole transport layer on the anode layer, a light-emitting material layer on the hole transport layer, and a cathode layer on the light-emitting material layer, and the hole transport layer comprises a hole type dopant having an electron-attracting group, and a mass ratio of the hole type dopant in the hole transport layer is 0.8% to 1.2%, and the hole type dopant comprises at least one of HAT-CN, $F_4$-TCNQ, $SbCl_5$ or $FeCl_3$.

In one embodiment, the light-emitting functional layer comprises an anode layer, a hole transport layer on the anode layer, a light-emitting material layer on the hole transport layer, and a cathode layer on the light-emitting material layer; and the hole transport layer comprises a hole type dopant having an electron-attracting group, and a mass ratio of the hole type dopant in the hole transport layer is 0.8% to 1.2%, and the hole type dopant comprises at least one of HAT-CN, $F_4$-TCNQ, $SbCl_5$ or $FeCl_3$.

In embodiments of the present application, a first light extraction unit comprising an ultraviolet light absorbing material disposed between a first light-emitting unit and a thin-film encapsulation layer is used. When sunlight or ultraviolet light irradiates a display panel, the first light extraction unit performs absorption or extinction of the ultraviolet light, thereby alleviating a reduction of the color temperature of the display panel caused by destructions of a light-emitting material in the first light-emitting unit by the ultraviolet light, and improving display effects of the display panel.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

The present application provides a display panel and a mobile terminal. In order to make the purpose, technical solutions, and effects of the present application clearer and clearer, the present application will be further described in detail below with reference to the accompanying drawings and embodiments. It should be understood that the specific embodiments described here are only used to explain the present application, and are not used to limit the present application.

Embodiments of the present application provide a display panel and a mobile terminal. Detailed descriptions are given below. It should be noted that the order of description in the following embodiments is not meant to limit the preferred order of the embodiments.

Figure 1:
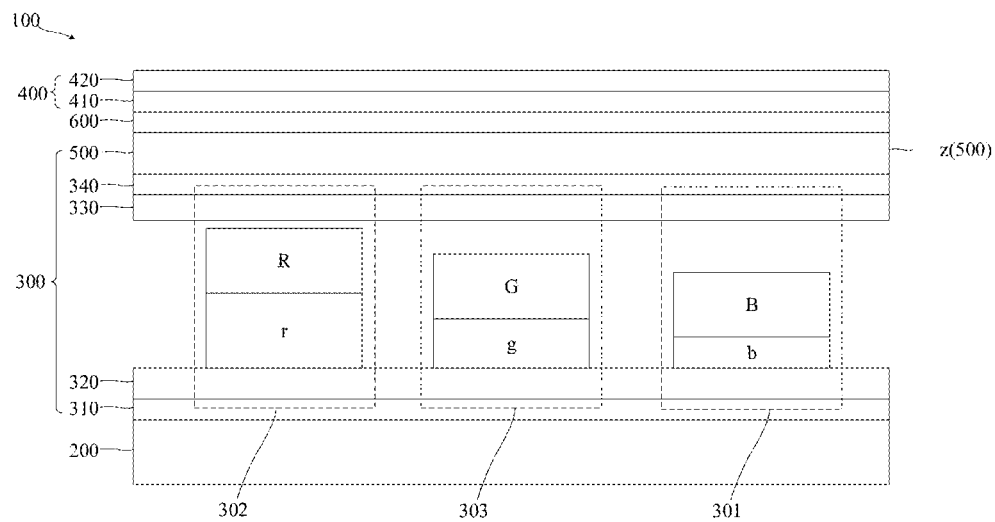
FIG. 1 is a schematic structural diagram of a first structure of a display panel provided by an embodiment of the present application.
Figure 2:
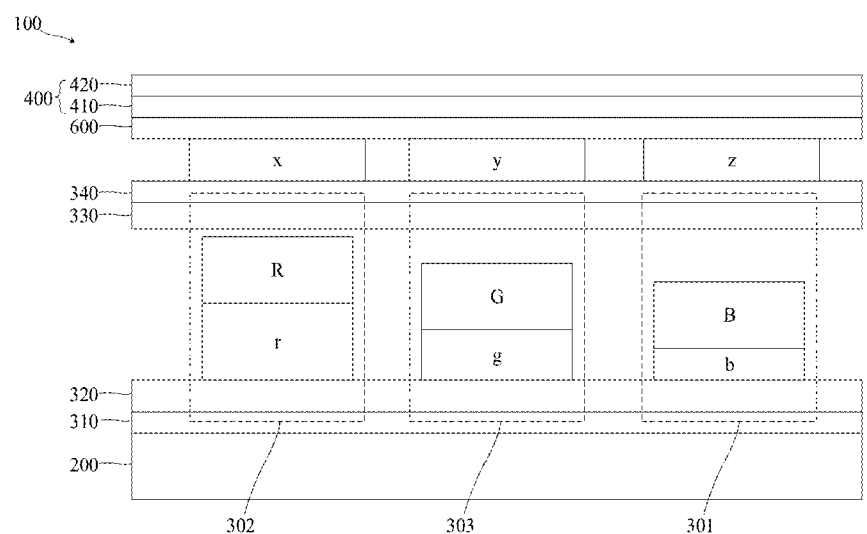
FIG. 2 is a schematic structural diagram of a second structure of a display panel provided by an embodiment of the present application.

Referring to FIG. 1 to FIG. 2, an embodiment of the present application provides a display panel 100 comprising a light-emitting functional layer 300 and a thin-film encapsulation layer 400 disposed on the light-emitting functional layer 300.

The light-emitting functional layer 300 comprises a plurality of first light-emitting units 301 that emit light of a first color and a plurality of first light extraction units z arranged corresponding to the first light-emitting units 301. The first light extraction units z are located between the first light-emitting units 301 and the thin-film encapsulation layer 400;

Herein, the light of the first color is blue light, the first light extraction units z comprise an ultraviolet light absorbing material, and an extinction coefficient of the first light extraction units z for the ultraviolet light is greater than an extinction coefficient of the thin-film encapsulation layer 400 for ultraviolet light.

In embodiments of the present application, a first light extraction unit comprising an ultraviolet light absorbing material disposed between a first light-emitting unit and a thin-film encapsulation layer is used. When sunlight or ultraviolet light irradiates a display panel, the first light extraction unit performs absorption or extinction of the ultraviolet light, thereby alleviating a reduction of the color temperature of the display panel caused by destructions of a light-emitting material in the first light-emitting unit by the ultraviolet light, and improving display effects of the display panel.

Technical solutions of the present application will now be described in conjunction with specific embodiments.

In this embodiment, after a black body is heated, it gradually turns from black to red, then turns yellow, then turns white, and finally emits blue light. Influences of ultraviolet light on a blue light-emitting unit can be reduced by protect the blue light-emitting unit, thereby increasing a brightness of the blue light and positively improving a color temperature.

In this embodiment, the display panel 100 further comprises an array substrate 200. The array substrate 200 comprises a substrate, a buffer layer on the substrate, an active layer on the buffer layer, a first insulating layer on the active layer, a gate layer on the first insulating layer, a second insulating layer on the gate layer, a source/drain layer on the second insulating layer, and a third insulating layer on the source/drain layer. The light-emitting functional layer 300 is located on the third insulating layer. Please refer to FIG. 1 for details.

In this embodiment, a material of the substrate can be made of one of urethane rubber, acrylic acid, silicone rubber, or polyimide, and has good stretchability.

In this embodiment, the material of the first light extraction unit z further comprises organic small molecular materials, such as benzenes and pyrenes, which provide a base material for the first light extraction unit z. The first light extraction unit z can converge the light emitted by the first light-emitting unit 301, thereby increasing a light-emitting rate of the display panel 100.

In this embodiment, the present application adds an ultraviolet light absorbing material to the first light extraction unit z, and the ultraviolet light can be absorbed or vanished when light or ultraviolet light is irradiated on the display panel 100, thereby reducing damages of the light-emitting material in the first light-emitting unit 301 by the ultraviolet light, alleviating decreases in a color temperature of the display panel 100 after being irradiated by sunlight or the ultraviolet light, and enhancing display effects of the display panel 100.

In this embodiment, the ultraviolet light absorbing material comprises at least one of benzotriazole derivatives, salicylate esters, benzophenones, benzotriazoles, substituted acrylonitrile triazines and triazines.

Benzene is selected as the ultraviolet light absorbing material in order to improve a mutual solubility between the ultraviolet light absorbing material and the base material of the first light extraction unit z and simultaneously minimize performance impacts to the base material of the first light extraction material.

In this embodiment, a mass ratio of the ultraviolet light absorbing material in the first light extraction unit z is 0.01% to 0.05%.

The mass ratio of the ultraviolet light absorbing material in the first light extraction unit z should not be too large. Convergences and extraction of the light of the first light-emitting unit 301 of the first light extraction unit z will be deduced due to the too large mass ratio of the ultraviolet light absorbing material in the first light extraction unit z. If the mass ratio of the ultraviolet light absorbing material in the first light extraction unit z is less than 0.01%, the effect of ultraviolet light absorption will be greatly reduced.

In this embodiment, an ultraviolet light absorbing material is added to the first light extraction unit z, and the extinction coefficient of the first light extraction unit for light with a wavelength of 390 nm is 0.85 $mol^{-1}$ $cm^{-1}$ to 0.95 $mol^{-1}$ $cm^{-1}$, and the extinction coefficient of the first light extraction unit for light with a wavelength of 400 nm is 0.55 $mol^{-1}cm^{-1}$ to 0.65 $mol^{-1}cm^{-1}$. The addition of the ultraviolet light absorbing material can increase the extinction coefficient of near-ultraviolet light, which can effectively absorb or eliminate ultraviolet light but have little effect on the light-emitting of visible light, thereby ensuring normal transmission of visible light. If the extinction coefficient is too large, the transmittance of the visible light will be affected. If the extinction coefficient is too small, poor absorption of ultraviolet light is thus resulted.

In this embodiment, the light-emitting functional layer 300 comprises an anode layer 310, a hole transport layer 320 on the anode layer 310, a light-emitting material layer on the hole transport layer 320, and an upper cathode layer 340 on the light-emitting material layer, please refer to FIG. 1 for details.

In this embodiment, the light-emitting material layer may comprise a material emitting any color of red, green and blue, and the light-emitting material layer comprises a first light-emitting material unit B, a second light-emitting material unit R, and a third light-emitting material unit G, thereby forming the corresponding first light-emitting unit 301, the second light-emitting unit 302, and the third light-emitting unit 303, please refer to FIG. 1 for details.

In this embodiment, the light-emitting functional layer 300 further comprises a cavity-length functional layer located between the light-emitting material layer and the hole transport layer 320. The cavity-length functional layer comprises a cavity length functional layer, a first cavity length functional unit b corresponding to the first light-emitting unit 301, a second cavity length functional unit r corresponding to the second light-emitting unit 302, and a third cavity length functional unit g corresponding to the third light-emitting unit 303, please refer to the FIG. 2 for details. Each cavity length functional unit in the cavity length functional layer is able to adjust a length of a light-emitting cavity of the light-emitting unit of different colors to achieve a cavity length corresponding to the best microcavity effect of each color light and improve a light extraction rate.

In this embodiment, the light-emitting functional layer 300 further comprises an electron transport layer 330 located between the cathode layer 340 and the light-emitting material layer.

In this embodiment, the light-emitting functional layer 300 further comprises an electron injection layer located between the electron transport layer 330 and the cathode layer 340 and a hole injection layer located between the hole transport layer 320 and the anode layer 310.

In this embodiment, the display panel 100 further comprises a LiF layer 600 located between the light extraction layer 500 and the thin-film encapsulation layer 400. The LiF layer 600 has a certain barrier effect on water vapor and oxygen, and can prevent water vapor and oxygen from entering the light-emitting functional layer 300.

In this embodiment, the light-emitting functional layer 300 comprises a light extraction layer 500 located between the cathode layer 340 and the thin-film encapsulation layer 400. The light extraction layer 500 may only comprise the first light extraction unit z of a whole layer setting, please refer to FIG. 1 for details. The light extraction layer 500 may also comprise the first light extraction unit z, the second light extraction unit x, and the third light extraction unit y, respectively corresponding to a different color of the light-emitting unit, please refer to FIG. 2 for details.

In this embodiment, the light-emitting functional layer 300 further comprises a plurality of second light-emitting units 302 that emit light of the second color, a plurality of third light-emitting units 303 that emit light of the third color, a plurality of second light extraction unit x corresponding to the second light-emitting units 302 and a plurality of third light extraction units y corresponding to the third light-emitting units 303. Herein, the first color light is blue light, the second color light is red light, and the third color light is green light, please refer to FIG. 2 for details.

In this embodiment, an experiment condition of an irradiation experiment comprises light of a wavelength of 340 nm, an intensity of 0.6 W/m², a test temperature of display panel 100 under 60° C., an ambient temperature of 40° C., an irradiation period of 16 hours, and a pause period after irradiation of 8 hours. One irradiation period and one pause period after irradiation form a group, a complete irradiation experiment comprises 5 groups, and the irradiation and the pause period are carried out alternately.

In this embodiment, after sunlight or ultraviolet light is irradiated, a brightness of R increases and a brightness of B decreases, resulting in a negative deviation of the color temperature variation of the whole module. In order to save costs, take an entire layer of the first light extraction unit z as an example, in a top view direction of the display panel 100, the first light extraction unit z is laid over the entire layer, and the first light extraction unit z covers the first light-emitting unit 301, the second light-emitting unit 302, and the third light-emitting unit 303. That is, the film unit for light extraction is entirely covered, and the light extraction layer 500 only comprises the first light extraction unit z. For details, please refer to FIG. 1, the process is simple and the cost is low.

In this embodiment, by adding an ultraviolet light absorbing material to the first light extraction unit z, it is beneficial to improve a display color temperature. The specific characterization results are as follows:

A first experiment condition (Exp. 1) is carried out. The first experiment condition comprises the first light extraction unit z without adding the ultraviolet light absorbing material, an extinction coefficient of 0.7 mol$^{-1}$cm$^{-1}$ of the first light extraction unit z for light with a wavelength of 390 nm, and an extinction coefficient of 0.53 mol$^{-1}$cm$^{-1}$ for light with a wavelength of 400 nm.

Figure 4:
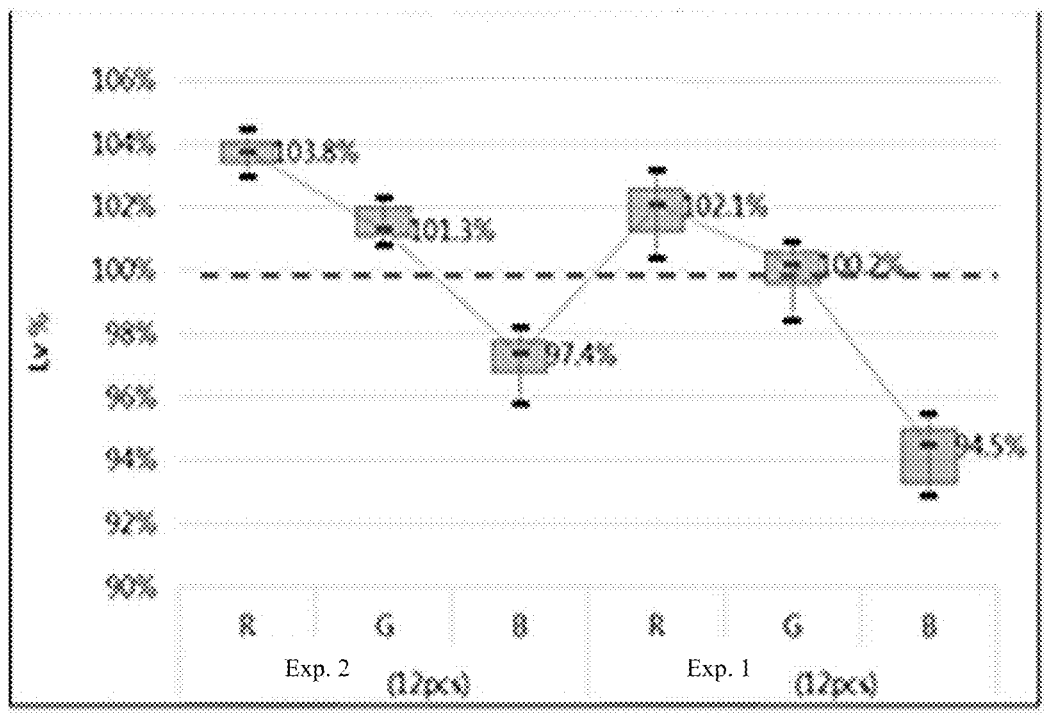
FIG. 4 is a first diagram of characterized effects of a display panel provided by an embodiment of the present application.
Figure 5:
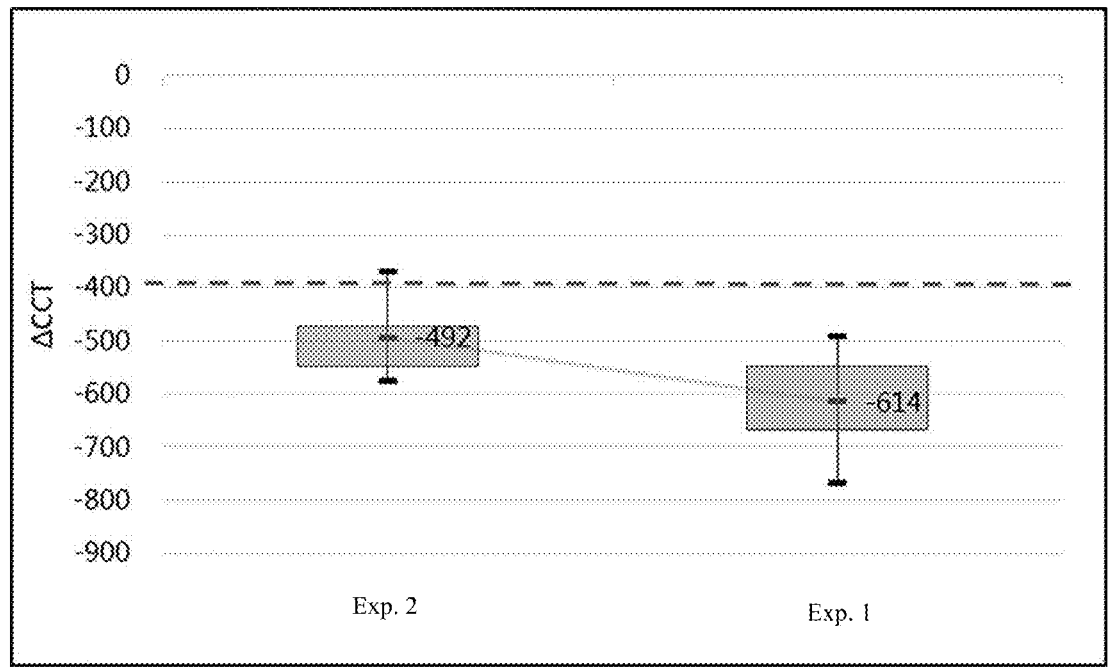
FIG. 5 is a second diagram of characterized effects of the display panel provided by the embodiment of the present application.

In this embodiment, after a complete irradiation experiment, compared with the prior experiment, a brightness of R is increased to 102.1%, a brightness of G is increased to 100.2%, and a brightness of B is decreased to 94.5%. Compared with the prior experiment, a color temperature change of the full display panel 100 is −614K, please refer to FIG. 4 and FIG. 5 for details.

A second experiment condition (Exp. 2) is carried out. The second experiment condition comprises an ultraviolet light absorbing material added to the first light extraction unit z to adjust a mass ratio of the ultraviolet light absorbing material in the first light extraction unit z, and an extinction coefficient of 0.9 mol$^{-1}$ cm$^{-1}$ for light with a wavelength of 390 nm and an extinction coefficient of 0.6 mol$^{-1}$ cm$^{-1}$ for light with a wavelength of 400 nm of the first light extraction unit z.

In this embodiment, after a complete irradiation experiment, a brightness comparison before the experiment and a rise and reduce amplitude compared with the first experiment condition are: the brightness of R is raised to 103.9% with an increasement of 1.8%, a brightness of G is raised to 101.3% with an increasement of 1.1%, a brightness of B is decreased to 97.4% with a decrease by 2.9%. Compared with the previous experiment, the color temperature change of the full display panel 100 is −492K. Compared with the first experiment condition, a color temperature is positively improved by +122K, so it is not difficult to tell that the ultraviolet light absorbing material is beneficial to improve the display color temperature. Please refer to FIG. 4 and FIG. 5.

In this embodiment, comparison between the first light extraction unit z (corresponding to the second experiment condition) with addition of the ultraviolet light absorbing material and the first light extraction unit z (corresponding to the first experiment condition) without the addition of ultraviolet light absorbing material and refractive index for visible light thereof are shown in the following table 1:

TABLE 1

| | extinction coefficient/ (mol$^{-1}$cm$^{-1}$) | | refractive index | | |
|---|---|---|---|---|---|
| wavelength of light/nm | 390 | 400 | 460 | 530 | 620 |
| 1$^{st}$ experiment condition | 0.70 | 0.53 | 2.09 | 1.96 | 1.90 |
| 2$^{nd}$ experiment condition | 0.90 | 0.60 | 2.07 | 1.93 | 1.87 |

Figure 12:
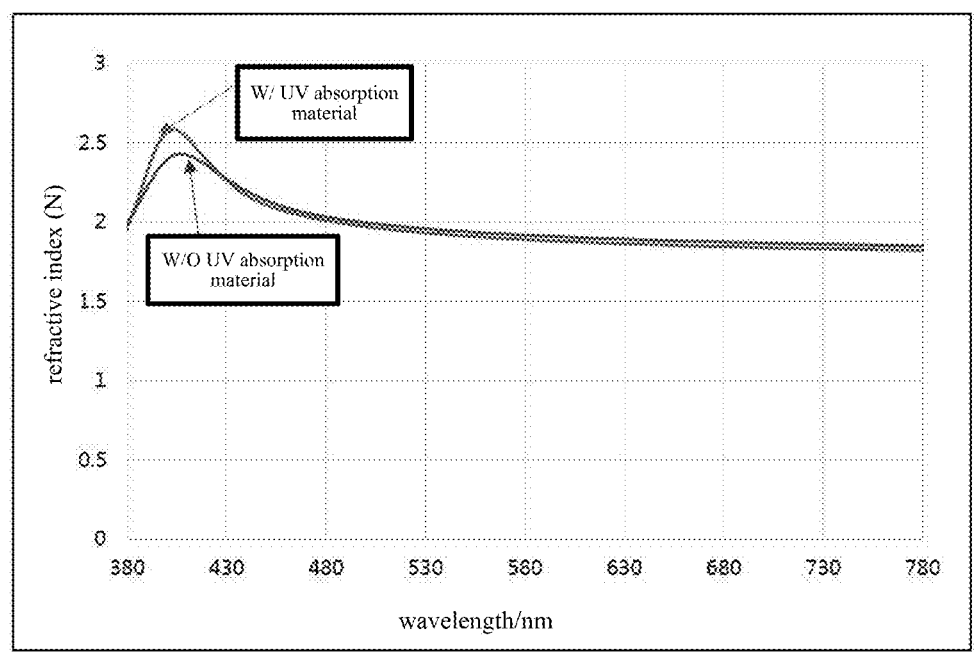
FIG. 12 is a ninth diagram of characterized effects of a display panel provided by an embodiment of the present application.

For details, please refer to FIG. 12, the first light extraction unit z without addition of the ultraviolet light absorbing material has a refractive index of 2.09 for light with a wavelength of 460 nm, a refractive index of 1.96 for light with a wavelength of 530 nm, and a refractive index of 1.90 for light with a wavelength of 620 nm. The first light extraction unit z added with the ultraviolet light absorbing material has a refractive index of 2.07 for light with a wavelength of 460 nm, a refractive index of 1.93 for light with a wavelength of 530 nm, and a refractive index of 1.87 for light with a wavelength of 620 nm. Therefore, the addition of ultraviolet light absorbing materials has basically no effect on the normal light output rate of RGB visible light, and it can be used normally.

In this embodiment, the second light extraction unit x or/and the third light extraction unit y comprise an ultraviolet light absorbing material.

In this embodiment, an extinction coefficient of the first light extraction unit z for ultraviolet light is greater than an extinction coefficient of the second light extraction unit x for ultraviolet light. The blue light-emitting material unit B is strengthened to absorb ultraviolet light, because the blue light-emitting material unit B is more sensitive to ultraviolet light and large brightness changes and color temperature changes are more easily happened therein. Preferably, an extinction coefficient of the second light extraction unit x to ultraviolet light is greater than an extinction coefficient of the third light extraction unit y to ultraviolet light. The red light-emitting material unit R is more sensitive to ultraviolet light than the green light-emitting material unit G, and the red light-emitting material unit R is further optimized. Adding different concentrations of ultraviolet light absorbing material to the light-emitting material units of different colors balances the relationship between absorption of ultraviolet light and the light output rate, and ensures that the light output rate of the display panel 100 is increased as much as possible under the condition of improving the color temperature.

In this embodiment, a refractive index of any inorganic film layer in the thin-film encapsulation layer 400 is less than a refractive index of the first light extraction unit z. The thin-film encapsulation layer 400 comprises a silicon nitride compound or/and a silicon oxide compound, and the first light extraction unit z comprises organic substances. The extraction unit z (may also comprise the second light extraction unit x and the third light extraction unit y) is the film layer for increasing the refractive index of the display panel 10. The refractive index of the first light extraction unit z is greater than any inorganic film in the thin-film encapsulation layer 400. The too large refractive index of the thin-film encapsulation layer 400 is to easily cause color shift in an edge area of the light. At the same time, the first light extraction unit z can also be used to converge the light in advance, which improves the light extraction rate on the one hand and avoids a crosstalk of adjacent color lights on the other hand.

In this embodiment, the refractive index of any inorganic film layer in the thin-film encapsulation layer 400 is 1.78 to 1.85. Preferably, the refractive index of any inorganic film layer in the thin-film encapsulation layer 400 is 1.81. Experiments have found that compared with the refractive index of any inorganic film layer in the thin-film encapsulation layer 400, the refractive index is less than 1.78, and the refractive index of the encapsulation layer 400 is limited to a range to enhance the light extinction effect. If the refractive index of the thin-film encapsulation layer 400 is too large, it is easy to cause color shift in the edge area of the light. If the refractive index of the thin-film encapsulation layer 400 is too low, the experiments show easily failures during packaging.

In this embodiment, by increasing the average refractive index of the thin-film encapsulation layer 400, it is beneficial to improve the display color temperature. The specific characterization results are as follows:

A third experiment condition (Exp. 3) is carried out, and the third experiment condition comprises the refractive index of any inorganic film layer in the thin-film encapsulation layer 400 is 1.76.

Figure 6:
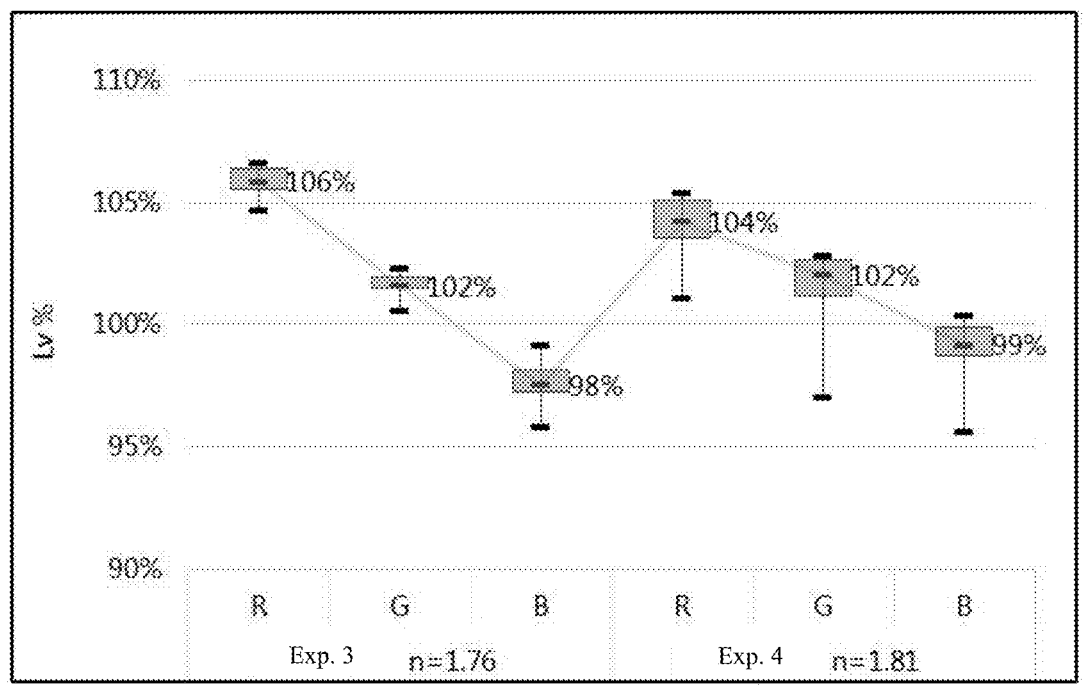
FIG. 6 is a third diagram of characterized effects of the display panel provided by the embodiment of the present application.
Figure 7:
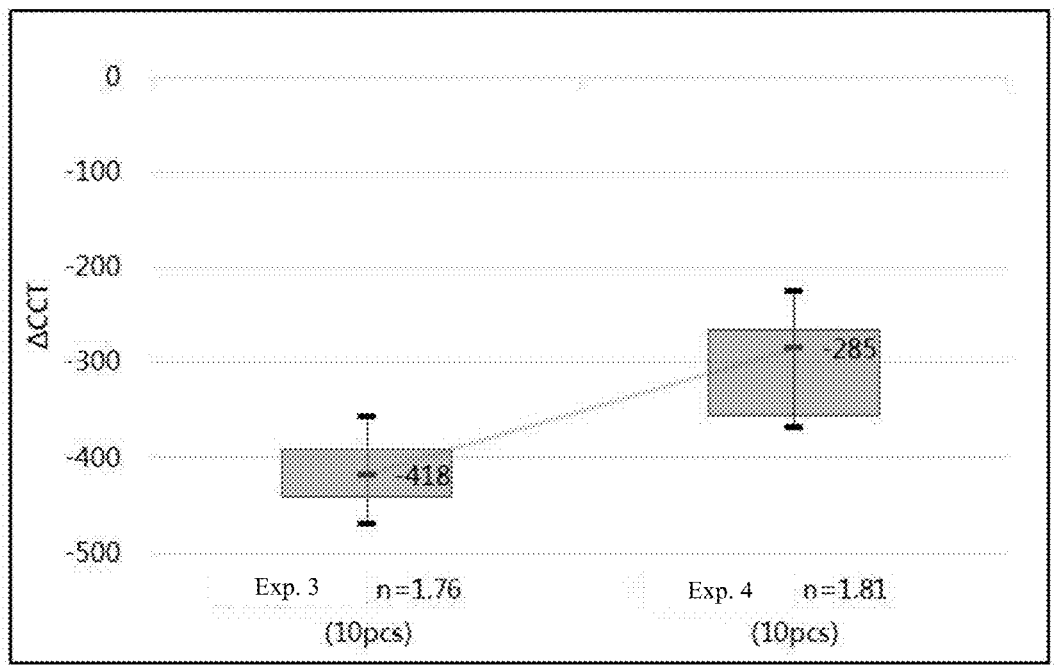
FIG. 7 is a fourth diagram of characterized effects of the display panel provided by the embodiment of the present application.

In this embodiment, after a complete irradiation experiment, compared with the prior experiment, the brightness of R is increased to 106%, the brightness of G is increased to 102%, and the brightness of B is reduced to 96%. Compared with the prior experiment, a color temperature change of the full display panel 100 is −418K, please refer to FIG. 6 and FIG. 7 for details.

A fourth experiment condition (Exp. 4) is carried out, and the fourth experiment condition comprises the refractive index of any inorganic film layer in the thin-film encapsulation layer 400 is 1.81.

In this embodiment, a brightness contrast compared with the prior experiment and an increase magnitude compared with the third condition experiment are as follows: the brightness of R is increased to 104, having a 2% reduction in the increase magnitude, the brightness of G is increased to 102%, having a 4% reduction in the increase magnitude, and the brightness of B is reduced to 99%, having a 3% reduction in a reduction magnitude. Compared with the prior experiment, a color temperature change of the full display panel 100 is −285K, and compared with the prior experiment, the color temperature of the full display panel could be positively improved by +133K. Therefore, it is not difficult to tell that appropriately increasing the refractive index of the thin-film encapsulation layer 400 and limiting the refractive index of any inorganic film layer in the thin-film encapsulation layer 400 to 1.78 to 1.85 are beneficial to improve the display color temperature. For details, please refer to FIG. 6 and FIG. 7.

In this embodiment, the thin-film encapsulation layer 400 comprises a first inorganic layer 410 on aside close to the light-emitting functional layer 300, and a second inorganic layer 420 on the first inorganic layer 410. Herein, a refractive index of the second inorganic layer 420 is greater than a refractive index of the first inorganic layer 410. The main function of the thin-film encapsulation layer 400 is to encapsulate and protect the optical functional layer, and adjust the nitrogen ratio of the two inorganic layers, so that the refractive index of the second inorganic layer 420 is greater than the refractive index of the first inorganic layer. 410. In the direction of light emission, the refractive index of the two inorganic layers gradually increases, which can increase the light extraction rate of light and enhance the display effect.

In this embodiment, the hole transport layer 320 comprises a hole type dopant having an electron-attracting group, and the hole type dopant comprising the electron-attracting group of a mass ratio of 0.8% to 1.2% in the hole transport layer 320, and the hole-type dopant comprises at least one of HAT-CN, $F_4$-TCNQ, $SbCl_5$ or $FeCl_3$.

Among them, a structural formula of HAT-CN is as follows:

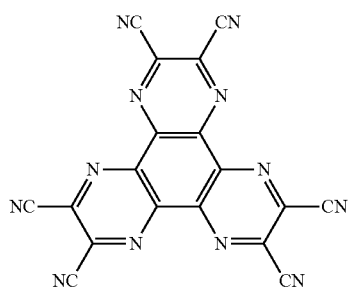 [SMILES: N#Cc1nc2c3nc(C#N)c(C#N)nc3c3nc(C#N)c(C#N)nc3c2nc1C#N]

Among them, a structural formula of $F_4$-TCNQ is as follows:

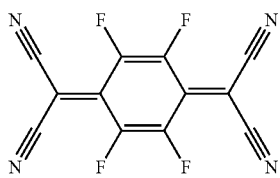 [SMILES: N#CC(C#N)=c1c(F)c(F)c(=C(C#N)C#N)c(F)c1F]

In this embodiment, by reducing a mass ratio of the hole-type dopant in the hole transport layer 320 with the electron-attracting groups, it is beneficial to improve the display color temperature. The specific characterization results are as follows:

A fifth experiment condition (Exp. 5) is carried out, and the fifth condition experiment comprises a mass ratio of the hole-type dopant in the hole transport layer 320 with the electron-attracting group is 1.5%.

Figure 8:
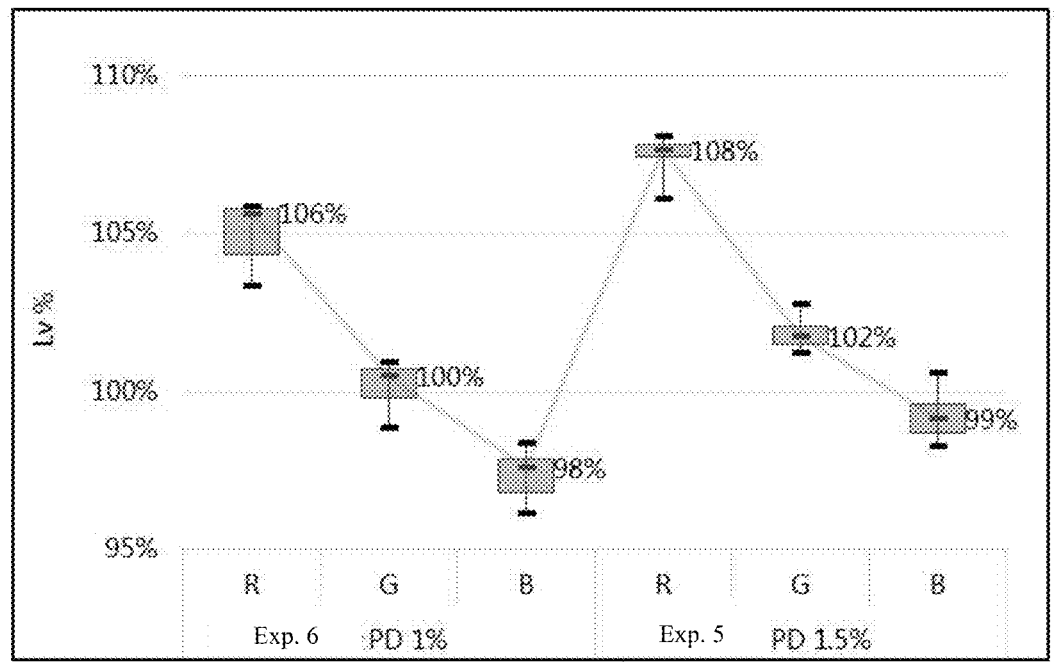
FIG. 8 is a fifth diagram of characterized effects of the display panel provided by the embodiment of the present application.
Figure 9:
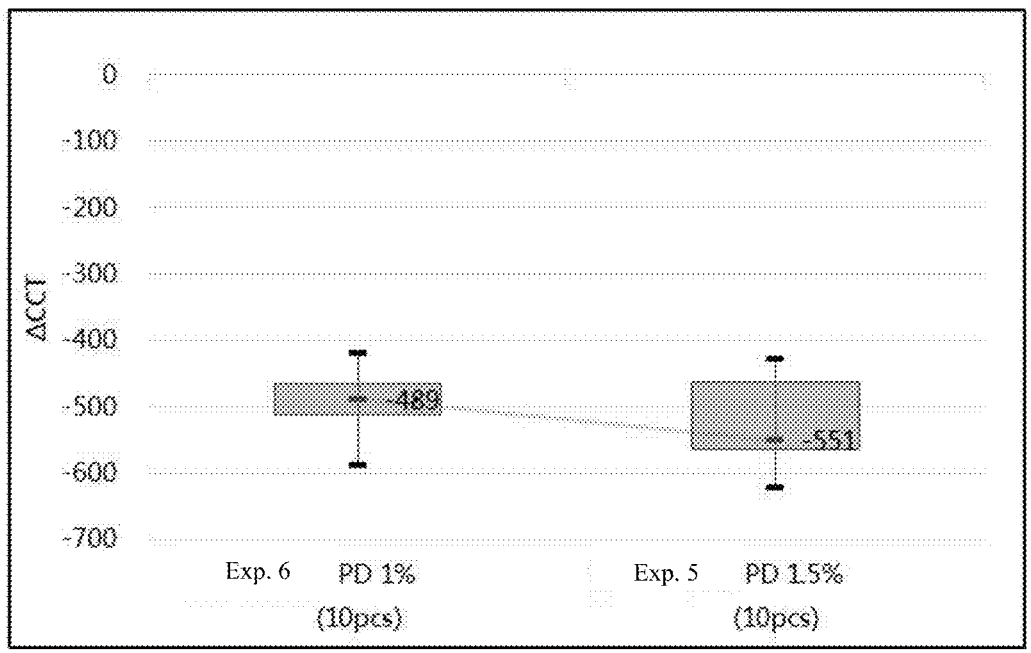
FIG. 9 is a sixth diagram of characterized effects of the display panel provided by the embodiment of the present application.

In this embodiment, after a complete irradiation experiment, compared with the prior experiment, the brightness of R is raised to 108%, the brightness of G is raised to 102%, and the brightness of B is reduced to 99%. Compared with the prior experiment, a color temperature change of the full display panel 100 is −551K, please refer to FIG. 8 and FIG. 9 for details.

A sixth experiment condition (Exp. 6) is carried out, and the fifth condition experiment comprises a mass ratio of the hole-type dopant in the hole transport layer 320 with the electron-attracting group is 1.0%.

In this embodiment, a brightness contrast compared with the prior experiment and an increase magnitude compared with the fifth condition experiment are as follows: the brightness of R is increased to 106, having a 2% reduction in the increase magnitude, the brightness of G is increased to 100%, having a 2% reduction in the increase magnitude, and the brightness of B is reduced to 98%, having a 1% reduction in a reduction magnitude. Compared with the prior experiment, a color temperature change of the full display panel 100 is −489K, and compared with the fifth experiment condition, the color temperature of the full display panel could be positively improved by +63K. Therefore, it is not difficult to tell that appropriately reducing the mass proportion of the hole-type dopant in the hole transport layer 320 and limiting the mass proportion of the hole transport layer 320 to 0.8% to 1.2% are beneficial to improve the display color temperature, please refer to FIG. 8 and FIG. 9.

In this embodiment, as the mass ratio of the hole-type dopant with electron-attracting groups in the hole transport layer 320 decreases, the positive improvement of the display panel 100 increases. The mass ratio of the dopant in the hole transport layer 320 is not less than 0.8%, and is preferably 0.8% to 1.0%. A mass ratio of the hole-type dopant with an electron-attracting group is used in the hole transport in the layer 320 is limited to a range to enhance the ultraviolet light extinction absorption effect.

Figure 3:
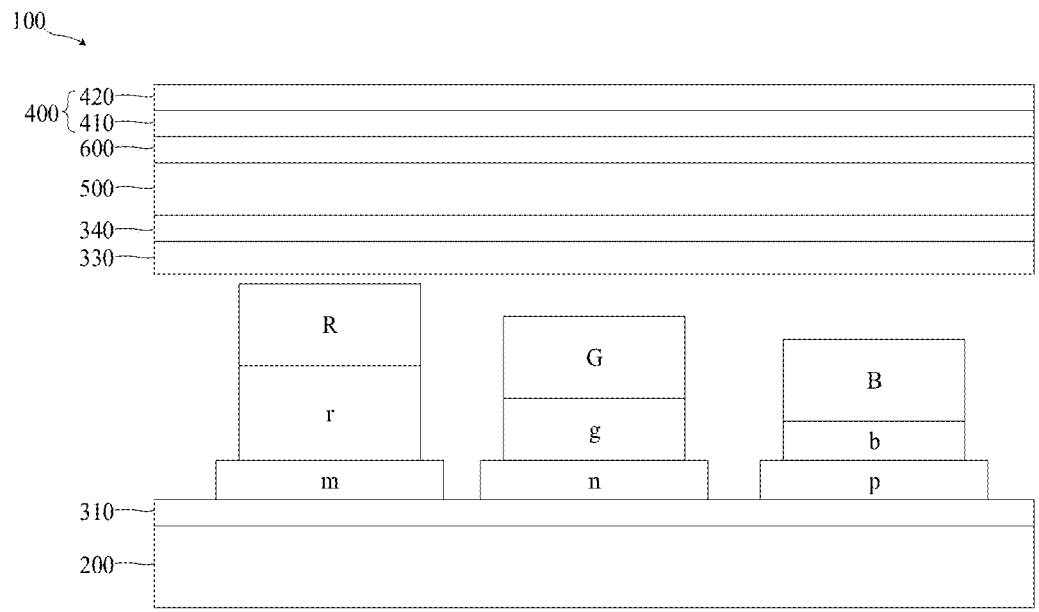
FIG. 3 is a schematic structural diagram of a third structure of a display panel provided by an embodiment of the present application.

In this embodiment, it can be seen that the red light-emitting unit is more sensitive to a mass ratio of the hole-type dopant in the hole transport layer 320, and the hole transport layer 320 comprises a blue hole transport unit p corresponding to the first light-emitting unit 301, a red hole transport unit m corresponding to the second light-emitting unit 302, and a green hole transport unit n corresponding to the third light-emitting unit 303, please refer to FIG. 3 for details. A content of the hole-type dopant comprising the electron-attracting group in the red hole transport unit m is less than a content of the hole-type dopant comprising the electron-attracting group in the blue hole transport unit p, and a content of the hole-type dopant comprising the electron-attracting group in the blue hole transport unit p is less than a content of the hole comprising the electron-attracting group in the green hole transport unit n, which not only ensures the light-emitting quality and efficiency, but also positively improves the color temperature of the display panel 100.

In this embodiment, the above three groups of single-variable experiments are combined, and an ultraviolet light absorbing material is added to the first light extraction unit z to increase a refractive index of any inorganic film layer in the thin-film encapsulation layer 400 and reducing a mass ratio of the hole-type dopant in the hole transport layer 320 with electron-attracting groups. Compared with the first light-emitting unit 301 without adding ultraviolet light absorption material, the thin-film encapsulation layer 400 has an average refractive index of 1.76 and a mass ratio of 1.5% of the hole-type dopant in the hole transport layer 320 with electron-attracting groups, which are beneficial to improve the display color temperature. Specific characterization results are as follows:

In this embodiment, a seventh experiment condition (Exp. 7) is carried out. The seventh experiment condition comprises that no ultraviolet light absorbing material is added to the first light-emitting unit 301, the refractive index of the thin-film encapsulation layer 400 is 1.76, and a mass ratio of the hole type dopants in the hole transport layer 320 with electron-attracting groups is 1.5%.

Figure 10:
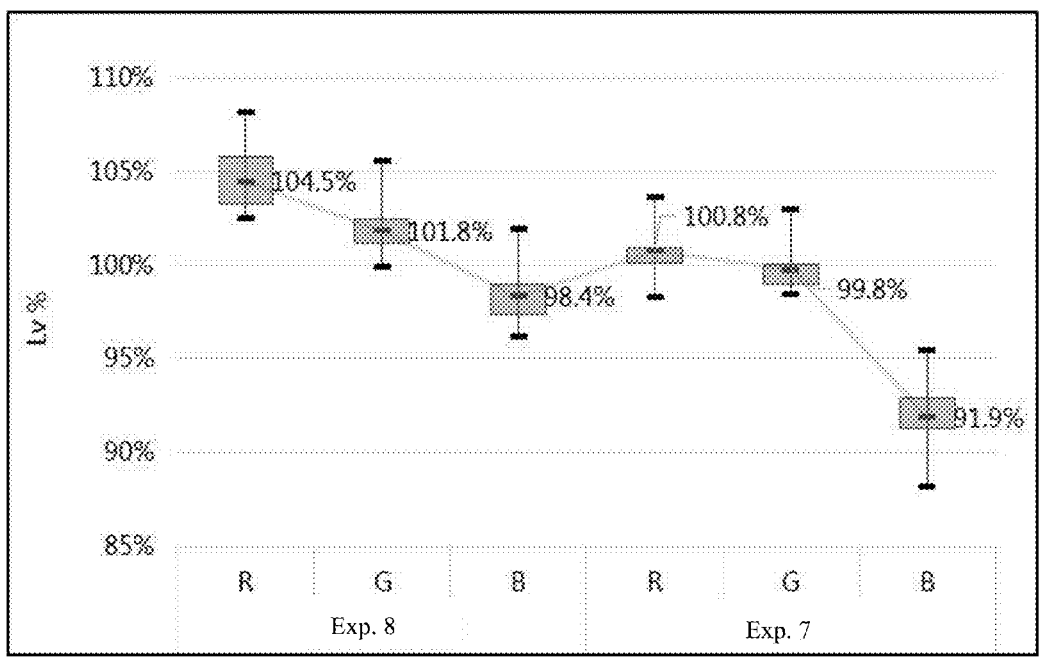
FIG. 10 is a seventh diagram of characterized effects of the display panel provided by the embodiment of the present application.
Figure 11:
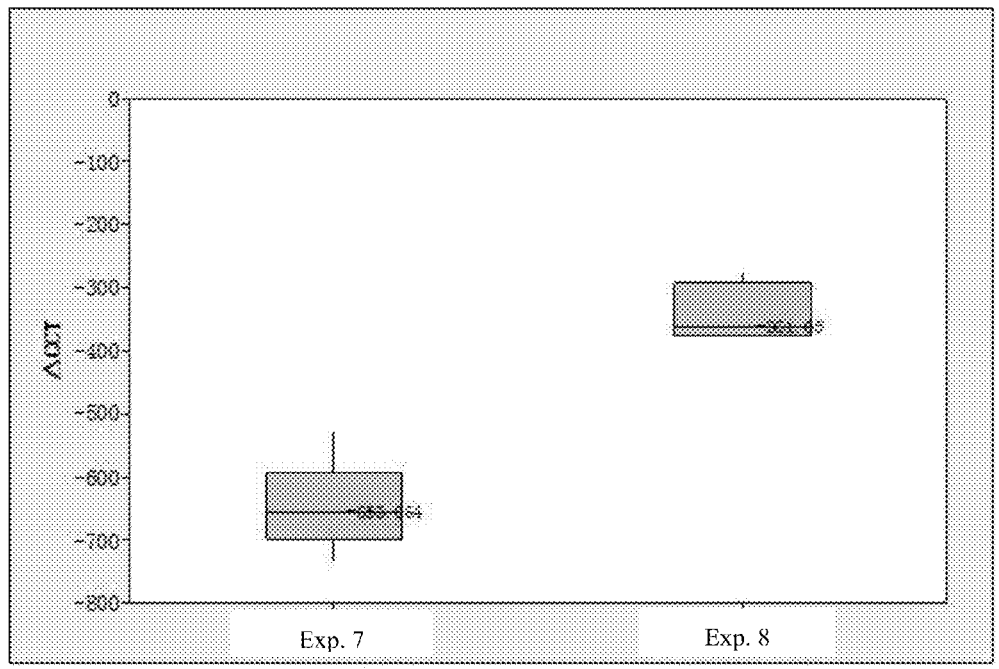
FIG. 11 is an eighth diagram of characterized effects of a display panel provided by an embodiment of the present application.

In this example, after a complete irradiation experiment, compared with the prior experiment, the brightness of R increased to 100.8%, the brightness of G decreased to 99.8%, and the brightness of B decreased to 91.9%. Compared with the prior experiment, the amount of color temperature change of the display panel 100 is −653.66K, please refer to FIG. 10 and FIG. 11 for details.

An eighth experiment condition (Exp. 8) is carried out. The eighth experiment condition comprises adding an ultraviolet light absorbing material to the first light extraction unit z, and the mass ratio of the ultraviolet light absorbing material in the first light extraction unit z is adjusted. An extinction coefficient of the first light extraction unit z for light with a wavelength of 390 nm is 0.9 $mol^{-1}$ $cm^{-1}$, an extinction coefficient for light with a wavelength of 400 nm is 0.6 $mol^{-1}$ $cm^{-1}$, a refractive index of the thin-film encapsulation layer 400 is 1.81, and a mass ratio of the hole-type dopant in the hole transport layer 320 with the electron-attracting group is 1.0%.

In this example, after a complete irradiation experiment, compared with the prior experiment, the brightness of R is increased to 104.5%, the brightness of G is increased to 101.8%, and the brightness of B is decreased to 98.4%.

Compared with the prior experiment, the color temperature change of the display panel 100 is −361.65K, which is positively improved by +292.01K when compared with the seventh experiment condition. Therefore, it is not difficult to tell that the ultraviolet light absorbing material is added to the first light extraction unit z, a combined experiment in which the refractive index of any inorganic film layer in the thin-film encapsulation layer 400 is increased, and the mass ratio of the hole-type dopant in the hole transport layer 320 with electron-attracting groups is reduced, which is beneficial to improve the display color temperature, and the overall color temperature change of the display panel 100 does not exceed ±400K, which reaches a better standard, please refer to FIG. 10 and FIG. 11 for details.

In the embodiment of the present application, a first light extraction unit comprising an ultraviolet light absorbing material is arranged between the first light-emitting unit and the thin-film encapsulation layer. When sunlight or ultraviolet light irradiates the display panel, the first light extraction unit treats the ultraviolet light and plays a role of absorbing or extinction, alleviating the reduction of the color temperature of the display panel caused by the destruction of the light-emitting material in the first light-emitting unit by the ultraviolet light, and improving the display effect of the display panel.

Figure 13:
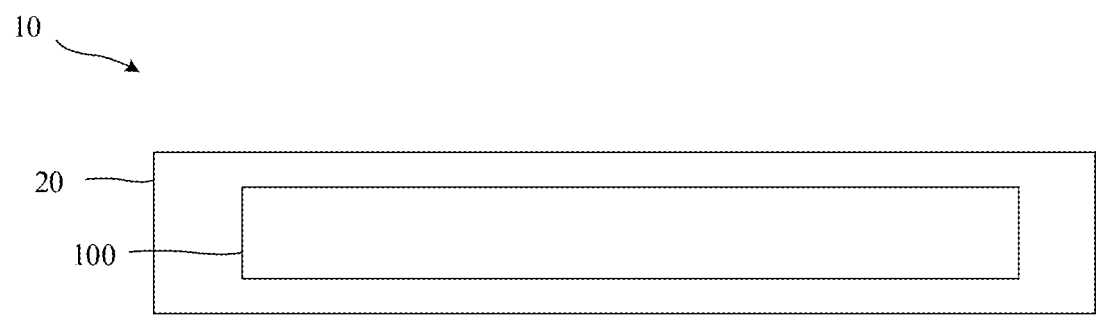
FIG. 13 is a schematic structural diagram of a mobile terminal provided by an embodiment of the present application.

Referring to FIG. 13, an embodiment of the present application also provides a mobile terminal 10, comprising any of the above-mentioned display panel 100 and a terminal body 20, and the terminal body 20 and the display panel 100 are combined into one body.

For the specific structure of the display panel 100, please refer to any of the above-mentioned embodiments of the display panel 100 and FIG. 1 to FIG. 12 which will not be repeated here.

In this embodiment, the terminal body 20 may comprise a middle frame, sealant, etc., and the mobile terminal 10 may be a mobile display terminal such as a mobile phone or a tablet, which is not limited herein.

Embodiments of the present application discloses a display panel and a mobile terminal. The display panel comprises a light-emitting functional layer and a thin-film encapsulation layer. The light-emitting functional layer comprises a plurality of first light-emitting units located between the first light-emitting unit and the thin-film encapsulation layer. The extinction coefficient of the first light extraction unit for ultraviolet light is greater than the extinction coefficient of the thin-film encapsulation layer for ultraviolet light. The first light extraction unit comprising the ultraviolet light absorbing material is provided. When the sun or ultraviolet light irradiates the display panel, the first light extraction unit absorbs or extinct the ultraviolet light, which relieves the effect of the ultraviolet light on the display panel. The destruction of the light-emitting material in a light-emitting unit leads to a decrease in the color temperature of the display panel, which improves the display effect of the display panel.

It can be understood that, for those of ordinary skill in the art, equivalent replacements or changes can be made according to the technical solutions of the present application and its inventive concept, and all these changes or replacements shall fall within the protection scope of the appended claims of the present application.

What is claimed is:

1. A display panel, comprising a light-emitting functional layer and a thin-film encapsulation layer on the light-emitting functional layer, wherein:

the light-emitting functional layer comprises a plurality of first light-emitting units of emitting light of a first color, a plurality of first light extraction units corresponding to the first light-emitting units, and the first light extraction units are located between the first light-emitting units and the thin-film encapsulation layer; and the light of the first color is blue light, the first light extraction units comprise an ultraviolet light absorbing material, and an extinction coefficient of the first light extraction units for the ultraviolet light is greater than an extinction coefficient of the thin-film encapsulation layer for the ultraviolet light.

2. The display panel according to claim 1, wherein the ultraviolet light absorbing material comprises at least one of benzotriazole derivatives, salicylate esters, benzophenones, benzotriazoles, substituted acrylonitrile triazines and triazines; and a mass ratio of the ultraviolet light absorbing material in the first light extraction unit is 0.01% to 0.05%.

3. The display panel of claim 1, wherein the extinction coefficient of the first light extraction unit for light with a wavelength of 390 nm is 0.85 mol$^{-1}$ cm$^{-1}$ to 0.95 mol$^{-1}$ cm$^{-1}$, and the extinction coefficient of the first light extraction unit for light with a wavelength of 400 nm is 0.55 mol$^{-1}$cm$^{-1}$ to 0.65 mol$^{-1}$cm$^{-1}$.

4. The display panel of claim 1, wherein the light-emitting functional layer further comprises a plurality of second light-emitting units emitting light of a second color, a plurality of third light-emitting units emitting light of a third color, a plurality of second light extraction units provided corresponding to the second light-emitting units, and a plurality of third light extraction units provided corresponding to the third light-emitting units; and the light of the second color is red light, the light of the third color is green light, and the extinction coefficient of the first light extraction units for ultraviolet light is greater than the extinction coefficient of the second light extraction unit for ultraviolet light.

5. The display panel according to claim 1, wherein the light-emitting functional layer further comprises a plurality of second light-emitting units emitting light of a second color and a plurality of third light-emitting units emitting light of a third color; and in a top view direction of the display panel, the first light extraction unit is formed as a whole layer, and the first light extraction unit covers the first light-emitting units, the second light-emitting units, and the third light-emitting units.

6. The display panel of claim 1, wherein a refractive index of any inorganic film layer in the thin-film encapsulation layer is less than a refractive index of the first light extraction units.

7. The display panel of claim 6, wherein the refractive index of any inorganic film layer in the thin-film encapsulation layer is 1.78 to 1.85.

8. The display panel of claim 7, wherein the thin-film encapsulation layer comprises a first inorganic layer on a side close to the light-emitting functional layer and a second inorganic layer on the first inorganic layer; and a refractive index of the second inorganic layer is greater than a refractive index of the first inorganic layer.

9. The display panel of claim 6, wherein the light-emitting functional layer comprises an anode layer, a hole transport layer on the anode layer, a light-emitting material layer on the hole transport layer, and a cathode layer on the light-emitting material layer; and the hole transport layer comprises a hole type dopant having an electron-attracting group, and a mass ratio of the hole type dopant in the hole transport layer is 0.8% to 1.2%, and the hole type dopant comprises at least one of HAT-CN, $F_4$-TCNQ, $SbCl_5$ or $FeCl_3$.

10. The display panel of claim 1, wherein the light-emitting functional layer comprises an anode layer, a hole transport layer on the anode layer, a light-emitting material layer on the hole transport layer, and a cathode layer on the light-emitting material layer; and the hole transport layer comprises a hole type dopant having an electron-attracting group, and a mass ratio of the hole type dopant in the hole transport layer is 0.8% to 1.2%, and the hole type dopant comprises at least one of HAT-CN, $F_4$-TCNQ, $SbCl_5$ or $FeCl_3$.

11. A mobile terminal, comprising a display panel and a terminal body, the terminal body and the display panel are combined into one body, and the display panel comprises a light-emitting functional layer and a thin-film encapsulation layer on the light-emitting functional layer, wherein:

the light-emitting functional layer comprises a plurality of first light-emitting units of emitting light of a first color, a plurality of first light extraction units corresponding to the first light-emitting units, and the first light extraction units are located between the first light-emitting units and the thin-film encapsulation layer; and the light of the first color is blue light, the first light extraction units comprise an ultraviolet light absorbing material, and an extinction coefficient of the first light extraction units for the ultraviolet light is greater than an extinction coefficient of the thin-film encapsulation layer for the ultraviolet light.

12. The mobile terminal according to claim 11, wherein the ultraviolet light absorbing material comprises at least one of benzotriazole derivatives, salicylate esters, benzophenones, benzotriazoles, substituted acrylonitrile triazines and triazines; and a mass ratio of the ultraviolet light absorbing material in the first light extraction unit is 0.01% to 0.05%.

13. The mobile terminal of claim 11, wherein the extinction coefficient of the first light extraction unit for light with a wavelength of 390 nm is 0.85 $mol^{-1}$ $cm^{-1}$ to 0.95 $mol^{-1}$ $cm^{-1}$, and the extinction coefficient of the first light extraction unit for light with a wavelength of 400 nm is 0.55 $mol^{-1}cm^{-1}$ to 0.65 $mol^{-1}cm^{-1}$.

14. The mobile terminal of claim 11, wherein the light-emitting functional layer further comprises a plurality of second light-emitting units emitting light of a second color, a plurality of third light-emitting units emitting light of a third color, a plurality of second light extraction units provided corresponding to the second light-emitting units, and a plurality of third light extraction units provided corresponding to the third light-emitting units; and the light of the second color is red light, the light of the third color is green light, and the extinction coefficient of the first light extraction units for ultraviolet light is greater than the extinction coefficient of the second light extraction unit for ultraviolet light.

15. The mobile terminal according to claim 11, wherein the light-emitting functional layer further comprises a plurality of second light-emitting units emitting light of a second color and a plurality of third light-emitting units emitting light of a third color; and in a top view direction of the display panel, the first light extraction unit is formed as a whole layer, and the first light extraction unit covers the first light-emitting units, the second light-emitting units, and the third light-emitting units.

16. The mobile terminal of claim 11, wherein a refractive index of any inorganic film layer in the thin-film encapsulation layer is less than a refractive index of the first light extraction units.

17. The mobile terminal of claim 16, wherein the refractive index of any inorganic film layer in the thin-film encapsulation layer is 1.78 to 1.85.

18. The mobile terminal of claim 17, wherein the thin-film encapsulation layer comprises a first inorganic layer on a side close to the light-emitting functional layer and a second inorganic layer on the first inorganic layer; and a refractive index of the second inorganic layer is greater than a refractive index of the first inorganic layer.

19. The mobile terminal of claim 16, wherein the light-emitting functional layer comprises an anode layer, a hole transport layer on the anode layer, a light-emitting material layer on the hole transport layer, and a cathode layer on the light-emitting material layer; and the hole transport layer comprises a hole type dopant having an electron-attracting group, and a mass ratio of the hole type dopant in the hole transport layer is 0.8% to 1.2%, and the hole type dopant comprises at least one of HAT-CN, $F_4$-TCNQ, $SbCl_5$ or $FeCl_3$.

20. The mobile terminal of claim 11, wherein the light-emitting functional layer comprises an anode layer, a hole transport layer on the anode layer, a light-emitting material layer on the hole transport layer, and a cathode layer on the light-emitting material layer; and the hole transport layer comprises a hole type dopant having an electron-attracting group, and a mass ratio of the hole type dopant in the hole transport layer is 0.8% to 1.2%, and the hole type dopant comprises at least one of HAT-CN, $F_4$-TCNQ, $SbCl_5$ or $FeCl_3$.

* * * * *